United States Patent [19]

Nossek

[11] 4,353,044
[45] Oct. 5, 1982

[54] SWITCHED-CAPACITOR FILTER CIRCUIT HAVING AT LEAST ONE SIMULATED INDUCTOR AND HAVING A RESONANCE FREQUENCY WHICH IS ONE-SIXTH OF THE SAMPLING FREQUENCY

[75] Inventor: Josef Nossek, Munich, Fed. Rep. of Germany

[73] Assignee: Siemens Aktiengesellschaft, Berlin & Munich, Fed. Rep. of Germany

[21] Appl. No.: 223,033

[22] Filed: Jan. 7, 1981

[30] Foreign Application Priority Data

Jan. 21, 1980 [DE] Fed. Rep. of Germany ....... 3002041

[51] Int. Cl.³ .................... H03H 19/00; H03H 11/48; H03H 17/02
[52] U.S. Cl. .................................. 333/173; 328/151; 333/19; 333/175
[58] Field of Search ................. 333/167, 173, 175, 19; 328/151, 165, 167; 364/724

[56] References Cited

U.S. PATENT DOCUMENTS 4,179,665 12/1979 Gregorian ...................... 333/173 X
4,313,096 1/1982 Fleischer ............................ 333/173

OTHER PUBLICATIONS

"Switched-Capacitor Filter Design Using the Bilinear z-Transformer", IEEE Transactions on Circuits and Systems, vol. CAS-25, No. 12, Dec., 1978, pp. 1039 through 1044.
"Switched Capacitor Circuits Bilinearly Equivalent to Floating Inductor or F.D.N.R.", Electronics Letters, Feb. 1, 1979, vol. 15, No. 3, pp. 87-88.
Gregorian–"Filtering Techniques with Switched–Capacitor Circuits", Microelectronics Journal, vol. 11, No. 2, Mar.–Apr., 1980, Mackintosh Publications, Ltd., Luton; pp. 13–21.

Primary Examiner—Marvin L. Nussbaum
Attorney, Agent, or Firm—Hill, Van Santen, Steadman, Chiara & Simpson

[57] ABSTRACT

A switched-capacitor filter circuit having at least one simulated inductor and having a resonance frequency which is one-sixth of the sampling frequency as pulse-controlled switches co-operatively operable for connecting a first capacitor to a pair of input terminals during a first clock phase and simultaneously connecting a second capacitor to the output of an inverting integration circuit, followed by discharge of the first capacitor to a capacitor in the integration circuit during a second clock pulse phase, followed by a third clock pulse phase during which the first capacitor is charged from the output of the integration circuit and the second capacitor is simultaneously connected to the pair of input terminals and during a fourth clock pulse phase the second capacitor discharges to the capacitor in the integration circuit.

14 Claims, 6 Drawing Figures

4,353,044

SWITCHED-CAPACITOR FILTER CIRCUIT HAVING AT LEAST ONE SIMULATED INDUCTOR AND HAVING A RESONANCE FREQUENCY WHICH IS ONE-SIXTH OF THE SAMPLING FREQUENCY

BACKGROUND OF THE INVENTION

The present invention relates to switched-capacitor filter circuits and in particular to such a circuit wherein the resonance frequency is one-sixth of the sampling frequency and wherein at least one simulated inductor is employed.

Switched-capacitor (SC) filters are known from the article "Switched-Capacitor Filter Design Using the Bilinear z-Transform" in the periodical "IEEE Transactions on Circuits and Systems", Vol. CAS-25, No. 12 December, 1978, pages 1039 through 1044 as well as from the article "Switched-Capacitor Circuits Bilinearly Equivalent to Floating Inductor or F.D.N.R." in the periodical "Electronics Letters", Feb. 1, 1979, Vol. 15, No. 3, pages 87 and 88. Such filters do not process time-continuous analog signals in the true sense, but rather process time-discrete signals which exist in the form of samples, which samples are generated according to a sampling frequency F via the relationship $T = 1/F$, where T is the sampling period. Circuits for generating such samples are known to those skilled in the art and are not explained in detail herein. Such sampling circuits may be pre- or post-connected to the known circuits illustrated, so that samples derived from an analog signal are supplied to the filter circuit at its input side and the signals available at the output side are re-converted into time-continuous analog signals. The significant technical advantage of such filters is that coils are simulated by means of active circuit elements and capacitors, which are suitable for the monolithic integration of larger filter circuits. Known operational amplifiers are predominantly employed as the amplifiers in those circuits and accordingly design objectives are to achieve the smallest possible number of circuit elements while still guaranteeing the stability of such circuits.

In the aforementioned known circuits, the inverting input is also connected via a capacitor to the output of an operational amplifier, a type of connection sometimes referred to as "counter-coupling". Some operational amplifiers employed are at times not counter-coupled or may require a high common mode rejection, because the inverting input of the operational amplifier is briefly not counter-coupled during certain switching phases, or the non-inverting input of the amplifier is not always held at ground potential. Moreover, the realization of the capacitors in such circuits is generally undertaken by metal-oxide-semiconductor (MOS) technology and the unavoidable ground capacitance associated with every floating MOS capacitor can lead to significant disruptions of the filter function.

A switched-capacitor filter circuit having at least one simulated inductor which can be employed both as a floating as well as a single-sided grounded coil and in which disruptions occurring due to switching operations are minimized is disclosed and claimed in my co-pending United States application Ser. No. 173,759, filed July 30, 1980 corresponding to German application P2932419.4 filed in Germany on Aug. 9, 1979.

SUMMARY OF THE INVENTION

It is an object of the present invention to provide a switched-capacitor filter circuit having at least one simulated inductance for the realization of a parallel resonance circuit having a resonance frequency which is one-sixth of the sampling frequency.

The above object is inventively achieved in a switched-capacitor filter circuit having a first capacitor which, during a first clock phase, is connected across a pair of input terminals and a second capacitor which is also during the first clock phase connected to the output of an inverting integration circuit. During a second clock pulse phase the first capacitor discharges to a feedback capacitor in the integration circuit and during a third clock pulse phase the first capacitor is charged from the output of the integration circuit and the second capacitor is simultaneously connected to the pair of input terminals. Finally, during a fourth clock pulse phase the second capacitor discharges to the capacitor of the integration circuit.

The above-described circuit is the equivalent of an inductor having an inductance L and a capacitor having a capacitance C connected in parallel and will have a resonance frequency equal to one-sixth of the sampling frequency F when the capacitance values are chosen equal to $C + T^2 4/L$, where T is the sampling period and is equal to $1/F$.

A floating parallel resonance circuit, that is a parallel resonance circuit having one side which is not connected to a reference potential, can be achieved by modifying the above-described circuit by the addition of respective switches connected between the first and second capacitors and the other of the input terminals, and respective switches connected between each of the first and second capacitors and the non-inverting input of an operational amplifier in the integration circuit.

A further embodiment employing one additional capacitor and associated clock pulse-controlled switches can be operated with only three clock pulse phases.

DESCRIPTION OF THE PREFERRED EMBODIMENTS

Figure 1:
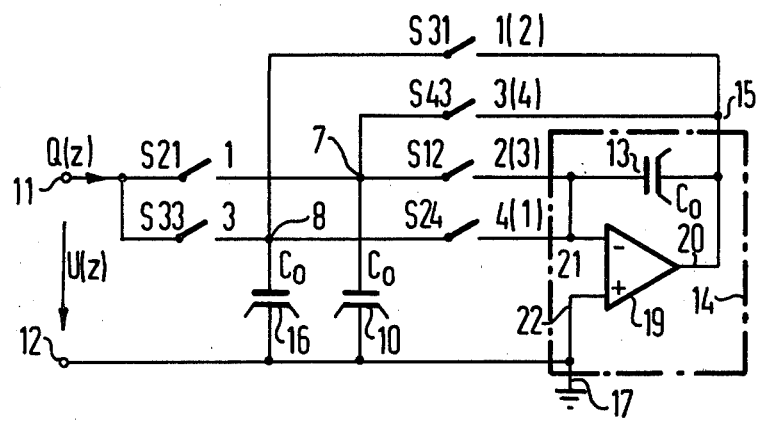
FIG. 1 is a circuit diagram of a switched-capacitor filter circuit having a parallel resonance frequency equal to one-sixth of the sampling frequency constructed in accordance with the principles of the present invention.

A two pole switch-capacitor filter circit is shown in FIG. 1 having a first input terminal 11 and a second input terminal 12 and also having an inverting integration circuit shown enclosed in the dashed lines 14. The inverting integration circuit 14 may be of any type known to those skilled in the art, however, in the exemplary embodiment shown in FIG. 1 the integration circuit 14 consists of an operational amplifier 19 having an inverting input 21 and a non-inverting input 22 and an output 20. The output 20 of the operational amplifier 19 also represents the output 15 of the integration circuit 14. The non-inverting input 22 is connected to a reference potential indicated at 17. The output 20 of the operational amplifier is connected to the inverting input 21 for negative feedback through a feedback capacitor 13 having a capacitance value of $C_o$.

The first input terminal 11 is connected to a first circuit node 7 through a first switch S21 and to a second circuit node 8 through a second switch S33. A first capacitor 10 is interconnected between the first circuit node 7 and the reference potential 17 and a second capacitor 16 is interconnected between the second circuit node 8 and the reference potential 17. The second input terminal 12 is also connected to the reference potential 17 as well as to the first and second capacitors 10 and 16. The first and second capacitors 10 and 16 also have a capacitance value of $C_o$.

A third switch S31 is interconnected between the output 15 of the integration circuit and the second circuit node 8, and a fourth switch S43 is interconnected between the output 15 and the first circuit node 7. A fifth switch S12 is interconnected between the inverting input 21 and the first circuit node 7, and a sixth switch S24 is interconnected between the inverting input 21 and the second circuit node 8.

Figure 2:
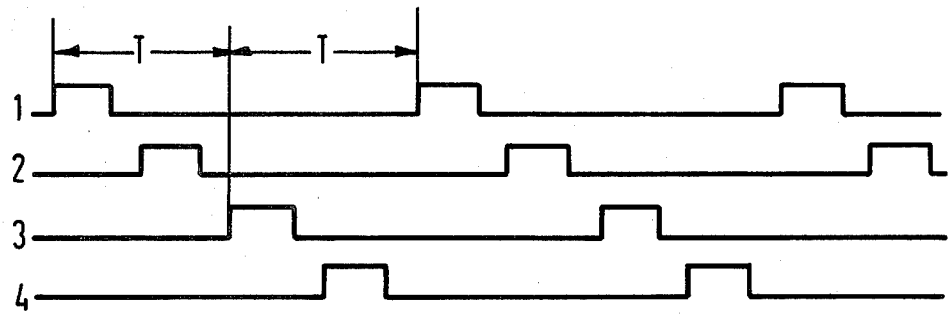
FIG. 2 is a clock pulse diagram showing four clock pulse phases for operating the circuits shown in FIGS. 1 and 4.

A clock pulse diagram for operating the circuit shown in FIG. 1 is illustrated in FIG. 2 comprised of clock pulse phases 1, 2, 3 and 4. The duty times of the pulses shown in FIG. 2 represent times during which the respective switches shown in FIG. 1 are closed. The clock pulse controlling each of the switches shown in FIG. 1 have been indicated in FIG. 1 next to each switch. Thus, the first and third switches S21 and S31 are each closed during the duty time of clock pulse phase 1, the second and fourth switches S33 and S43 are closed by clock pulse phase 3, the fifth switch S12 is closed by clock pulse phase 2 and the sixth switch S24 is closed by the clock pulse phase 4. As indicated in FIG. 1 by the numerals in parenthesis, the circuit can also be operated by closing the switch S31 by clock pulse phase 2, switch S43 by clock pulse phase 4, switch S12 by clock pulse phase 3 and switch S24 by clock pulse phase 1. It will be understood that all of the switches S31, S43, S12 and S24 must be consistently operated in one manner or the other.

As shown in FIG. 2, the clock phases 1, 2, 3 and 4 have non-overlapping sequential pulses and each have the same frequency. The clock pulses have a period of 2T and thus exhibit a frequency of ½T which is equal to one half of the sampling frequency 1/T.

If the switches shown in FIG. 1 are operated in either of the above-described modes of switch sequencing, during the first clock phase 1 the first capacitor 10 is charged and at the same time the second capacitor 16 is connected to the output 15 of the inverting integration circuit 14. The first capacitor 10 then discharges to the feedback capacitor 13 and subsequently in the third clock phase the first capacitor 10 is charged from the output of the integration circuit 14. At the same time the second capacitor 16 is connected across the first and second terminals 11 and 12. Finally, in the fourth clock phase the second capacitor 16 discharges to the feedback capacitor 13.

As stated above, the circuit is preferably operated with the capacitors 10, 13 and 16 each having the same capacitance value, namely $C_o$.

Figure 3:
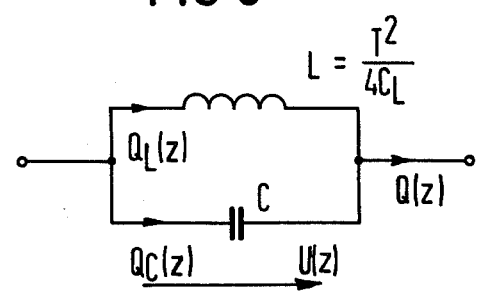
FIG. 3 is an equivalence circuit for the circuit shown in FIG. 1.

The equivalent circuit to the circuit shown in FIG. 1 is illustrated in FIG. 3 with the charge $Q_L(z)$ being transferred in the inductance L and the charge $Q_C(z)$ being transferred in the capacitor C. The total charge is designated as $Q(z)$ and a voltage drop $U(z)$ occurs. In order to achieve a resonance frequency which is one-sixth of the sampling frequency, namely F/6, the equivalent parallel resonance circuit shown in FIG. 3 is realized employing the circuit shown in FIG. 1, with the charge $Q(z)$ being received at the input terminal 11 and a voltage drop $U(z)$ occurring across the terminals 11 and 12, when the capacitors 10, 13 and 16 are selected to have a capacitance $C_o = C + C_L$, where $C_L = T^2/4L$ and $C = 3C_L$ resulting in $C_o = T^2/L$.

In general, the circuit shown in FIGS. 1 and 3 can also be utilized to achieve a grounded parallel oscillating circuit if the first and second capacitors 10 and 16 as well as the integration circuit 14 are connected to a reference potential. This embodiment is shown in FIG. 1 by the reference potential desiganted at 17 to which the capacitors 10 and 16 and the input terminal 12 are connected. The circuit shown in FIG. 1 can also be operated free of reference potential.

Figure 4:
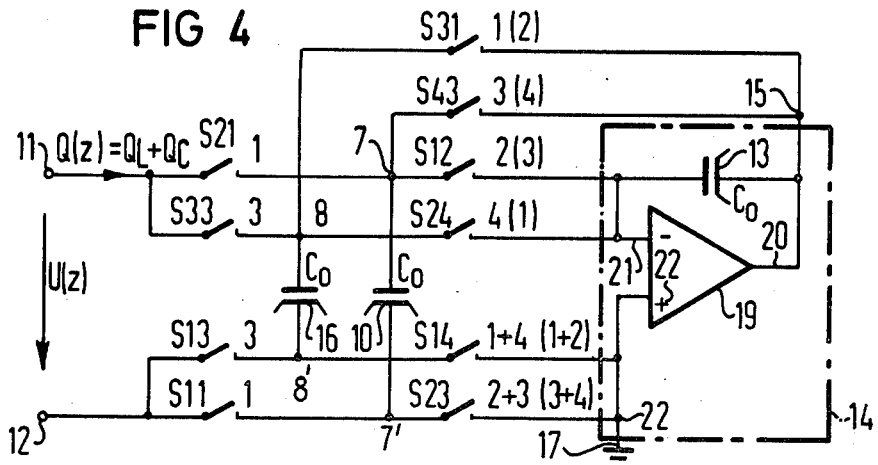
FIG. 4 is an embodiment of the circuit shown in FIG. 1 which realizes a floating parallel resonance circuit.

A circuit for realizing a floating parallel resonance circuit having a resonance frequency which is one-sixth of the sampling frequency is shown in FIG. 4. The term floating parallel resonance circuit means a resonance circuit having one side which is not connected to a reference potential. Comparing the circuits shown in FIG. 1 and FIG. 4, it will be apparent that the circuit of FIG. 4 employs the fundamental circuit elements shown in FIG. 1 and operates utilizing the four clock phases shown in FIG. 2. For those common elements, identical reference numerals are utilized in FIGS. 1 and 4 and the operation of the common elements to both circuits is the same and will not be repeated in connection with FIG. 4.

Elements shown in FIG. 4 not present in FIG. 1 include a seventh switch S13 operated by clock phase 3, an eighth switch S11 operated by clock phase 1, a ninth switch S14 which is closed during the duty times of both clock phase 1 and clock phase 4 or both clock phase 1 and clock phase 2, and a tenth switch S23 which is closed during the duty times of both clock phase 2 and clock phase 3, or both clock phase 3 and clock phase 4. The latter mode of operation of the switches S14 and S23 is utilized if the switches S31, S43, S12 and S24 are operated in the mode shown in parenthesis.

The eighth switch S11 is interconnected between the second terminal 12 and a third circuit node 7', while the tenth switch S23 is interconnected between the third circuit node 7' and the non-inverting input 22 of the amplifier 19. The first capacitor 10 is also connected to the third circuit node 7'. Similarly, the seventh switch S13 is interconnected between a fourth circuit node 8' and the second terminal 12 and the ninth switch S14 is interconnected between the fourth node 8' and the non-inverting input 22 of the amplifier 19. The second capacitor 16 is also connected to the fourth circuit node 8'.

As with the circuit shown in FIG. 1, the circuit in FIG. 4 operates as a parallel resonance circuit having a resonance frequency which is one-sixth of the sampling frequency when the capacitor values $C_o$ are chosen as described above in connection with the equivalent circuit shown in FIG. 3.

Figure 5:
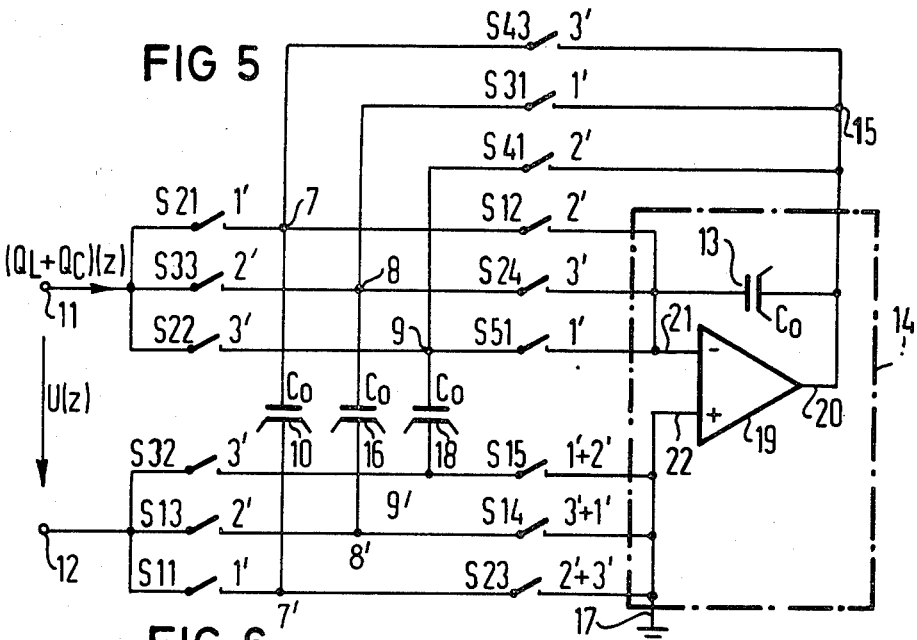
FIG. 5 is a further embodiment of the circuit shown in FIG. 1 employing an additional capacitor and associated switches.
Figure 6:
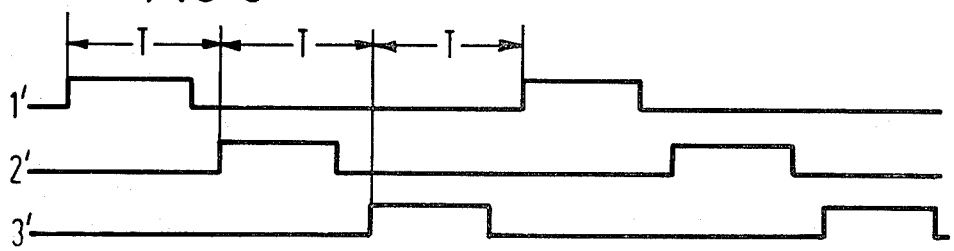
FIG. 6 is a clock pulse diagram showing three clock pulse phases for operating the circuit of FIG. 5.

A further variation of the circuits shown in FIGS. 1 and 4 is shown in FIG. 5 which utilizes only three clock phases which are illustrated in FIG. 6 as clock pulse phases 1', 2' and 3. As with the clock pulse phases shown in FIG. 2, the clock phases shown in FIG. 6 are sequential and non-overlapping, however, the phases shown in FIG. 6 have a period of 3T.

Again, elements common to FIGS. 5, 4 and 1 which have already been identified and the operation thereof explained will not be repeated in describing the operation of FIG. 5. Elements in FIG. 5 not present in FIGS. 4 and 1 include an eleventh switch S22 operated by the clock phase 3' which is interconnected between the first terminal and a fifth circuit node 9. A twelfth switch S51 operated by the clock phase 1' is interconnected between the node 9 and the inverting input 21 of the amplifier 19. In similar fashion, a thirteenth switch S32 operated by the clock phase 3' is interconnected between the second terminal 2 and a sixth circuit node 9' and a fourteenth switch S15 which is closed during the duty times of both clock phases 1' and 2' is interconnected between the sixth node 9' and the non-inverting input 22 of the amplifier 19. When operated in the circuit shown in FIG. 5, in contrast to the operation in FIG. 4, the ninth switch S14 is closed during the duty times of both clock phases 3' and 1' and the tenth switch S23 is closed during the duty times of both of the clock phases 2' and 3'.

A third capacitor 18, also having a capacitance $C_o$, is interconnected between the fifth and sixth circuit nodes 9 and 9' and is connected to the output 15 of the inverting integration circuit 14 via a fifteenth switch S41 which is operated by the clock phase 2'.

The remaining switches shown in FIG. 5 are operated by the clock phase shown nearest the switch, and in particular the first switch S21 is operated by the clock phase 1', the second switch S33 is operated by the clock phase 2', the third switch S43 is operated by the clock phase 3', the fourth switch S31 is operated by the clock phase 1', the fifth switch S12 is operated by the clock phase 2', the sixth switch S24 is operated by the clock phase 3', the seventh switch S13 is operated by the clock phase 2', and the eighth switch S11 is operated by the clock phase 1'.

Although only one additional capacitor 18 was added in the embodiment shown in FIG. 5, further capacitors also having a value $C_o$ can be added in the same manner if needed. Circuits with such additional capacitors, as well as the circuit shown in FIG. 5, operate in accordance with the rule that the sampling frequency 1/T is equal to (2+n) times the value of the clock frequency shown in FIG. 6, where n is the number of additional capacitors such as 18. The additional capacitors are connected alternately to the capacitors 10 and 16, to the pair of terminals 11 and 12, and to the output 15 of the integration circuit 14 and each discharge to the capacitor 13, as shown by the operation of the single additional capacitor represented by the third capacitor 18 in FIG. 5.

As discussed above, each of the circuits shown in FIGS. 1, 4 and 5 achieves a parallel resonance circuit having a resonance frequency which is one-sixth of the sampling frequency which can be integrated with relative ease and moreover insures that even during the switching of the individual switches the negative feedback between the output 20 of the amplifier 19 and the inverting input 21 through the capacitor 13 in the integration circuit 14 can be continuously maintained.

Although modifications and changes may be suggested by those skilled in the art it is the intention of the inventor to embody within the patent warranted hereon all changes and modifications are reasonably and properly come within the scope of his contribution to the art.

I claim as my invention:

1. A switched-capacitor filter circuit having at least one simulated inductance, said filter circuit operating as the equivalent of a parallel resonance circuit having an inductance L and a capacitance C and having a resonance frequency which is one-sixth of the sampling frequency for the circuit, said circuit comprising:
   first and second input terminals;
   a first capacitor;
   a means for connecting said first capacitor across said input terminals during a first clock phase;
   a second capacitor;
   an inverting integration circuit having a feedback capacitor and having an output;
   a means for connecting said second capacitor to the output of said inverting integration circuit during said first clock phase;
   a means for transferring a charge from said first capacitor to aid feedback capacitor during a second clock phase;
   a means for charging said first capacitor by the output of the integration circuit during a third clock phase;
   a means for connecting said second capacitor across said input terminals during said third clock phase; and
   a means for transferring a charge from said second capacitor to said feedback capacitor during a fourth clock phase, said first, second, third and fourth clock phases operating in cyclical fashion with non-overlapping duty times at the same clock frequency.

2. The switched-capacitor filter circuit of clam 1 wherein said clock frequency is equal to one half of said sampling frequency.

3. The switched-capacitor filter circuit of claim 1 wherein said first, second and feedback capacitors each have the same capacitance value.

4. The switched-capacitor filter circuit of claim 3 wherein said capacitance value is equal to $C+T^2/4L$, where T is the sampling period which is the reciprocal of said sampling frequency.

5. The switched-capacitor filter circuit of claim 1 wherein said first capacitor, said second capacitor and said inverting integration circuit are each connected to said second terminal, said second terminal being connected to a reference potential for operating said filter circuit as a grounded parallel resonance circuit.

6. The electronic filter circuit of claim 1 wherein said first and second capacitors are connected to a reference potential and further comprising:
   a means for disconnecting said first capacitor from said reference potential and simultaneously connecting said first capacitor to said second terminal during said first clock phase; and
   a means for disconnecting said second capacitor from said reference potential and simultaneously connecting said second capacitor to said second terminal during said third clock phase for operating said filter circuit as a floating parallel resonance circuit.

7. The switched-capacitor filter circuit of claim 1 further comprising:
   at least one additional capacitor;

a means for alternately connecting said additional capacitor across said input terminals and to the output of said integration circuit;

a means for transferring a charge from said additional capacitor to said feedback capacitor; and wherein said sampling frequency is equal to (2 +n) times said clock frequency where n is the number of additional capacitors.

8. The switched-capacitor filter circuit of claim 1 consists of an operational amplifier having an output which is said output of the inverting integration circuit, said operational amplifier having an inverting input and said feedback capacitor being interconnected between the output and inverting input of said operational amplifier, said inverting input of said operational amplifier serving as the input for said inverting integration circuit, and said operational amplifier having a non-inverting input connected to a reference potential.

9. The switched-capacitor filter circuit of claim 7 wherein said second input terminal is connected to a reference potential and wherein said first capacitor is interconnected between said second input terminal and a first circuit node and said second capacitor is interconected between said second input terminal and a second circuit node and wherein said means for connecting said first capacitor across said input terminals is a first switch which is closed during said first clock phase interconnected between said first input terminal and said first circuit node, said means for connecting said second capacitor across said input terminals is a second switch which is closed during said third clock phase interconnected between said first input terminal and said second circuit node, said means for connecting said second capacitor to the output of said inverting integration circuit is a third switch which is closed during said first clock phase interconnected between said integration circuit output and said second circuit node, said means for charging said first capacitor by the output of the integration circuit is a fourth switch which is closed during said third clock phase interconnected between said integration circuit output and said first circuit node, said means for transferring a charge from said first capacitor to said feedback capacitor is a fifth switch which is closed during said second clock phase interconnected between said input of said integration circuit and said first circuit node, and said means for transferring a charge from said second capacitor to said feedback capacitor is a sixth switch which is closed during said fourth clock phase interconnected between said integration circuit input and said second circuit node.

10. The switched-capacitor filter circuit of claim 9 wherein said filter circuit has a third circuit node disposed between said first capacitor and said second terminal and said reference potential, and a fourth circuit node disposed between said second capacitor and said second input terminal and said reference potential, and further comprising:

a seventh switch which is closed during said third clock phase interconnected between said fourth circuit node and said second input terminal;

an eighth switch which is closed during said first clock phase interconnected between said third circuit node and said second input terminal;

a ninth switch which is closed during said first and said fourth clock phases interconnected between said fourth circuit node and the refrence potential; and a tenth switch which is closed during said second and said third clock phases interconnected between said third circuit node and the reference potential, for operating said switched-capacitor filter circuit as a floating parallel resonance circuit.

11. A switched-capacitor filter circuit having at least one simulated inductance, said filter circuit operating as the equivalent of a parallel resonance circuit having an inductance L and a capacitance C and having a resonance frequency which is one-sixth of the sampling frequency for the filter circuit, said circuit comprising:

first and second input terminals;

a first capacitor interconnected between first and third circuit nodes;

a second capacitor interconected between second and fourth circuit nodes;

at least one additional capacitor interconnected between fifth and sixth circuit nodes;

an inverting integration circuit including an operational amplifier having inverting and non-inverting inputs and an output, a feedback capacitor interconnected between the output and the inverting input of the amplifier, said output of said amplifier serving as the output of said integration circuit and the inverting input of said amplifier serving as the input for said integration circuit, and said non-inverting input being connected to a reference potential;

a first switch interconnected between said first node and said first input terminal;

a second switch interconnected between said second node and said first input terminal;

a third switch interconnected between the output of said integration circuit and said first node;

a fourth switch interconnected between the output of said integration circuit and the second node;

a fifth switch interconnected between the input of said integration circuit and said first node;

a sixth switch interconnected between the input of said integration circuit and said second node;

a seventh switch interconnected between said second input terminal and said fourth node;

an eighth switch interconnected between said second input terminal and said third node;

a ninth switch interconnected between said fourth node and said reference potential;

a tenth switch interconnected between said third node and said reference potential;

an eleventh switch interconnected between said first input terminal and said fifth node;

a twelfth switch interconnected between said fifth node and said input of said integration circuit;

a thirteenth switch interconnected between the second input terminal and said sixth node;

a fourteenth switch interconected between said sixth node and said reference potential; and a fifteenth switch interconnected between said fifth node and the output of said integration circuit, said first, fourth, eighth, and twelfth switches being closed during a first clock phase, said second, fifth, seventh, and fifteenth switches being closed during a second clock phase, said third, sixth, eleventh, and thirteenth switches being closed during a third clock phase, said ninth switch being closed during said first and third clock phases, said tenth switch being closed during said second and third clock phases, and said fourteenth switch being closed during said first and second clock phases, said clock phases operating in cyclical fashion with non-overlapping duty times at the same clock frequency.

12. The switched-capacitor filter circuit of claim 11 wherein each of said capacitors has the same capacitance value.

13. The switched-capacitor filter circuit of claim 12 wherein said capacitance value is equal to $C+T^2/4L$, where T is the sampling period which is equal to the reciprocal of the sampling frequency.

14. The switched-capacitor filter circuit of claim 11 wherein said clock frequency is equal to $1/(2+n)$ times the sampling frequency where n is the number of additional capacitors.

* * * * *